United States Patent
Quek et al.

(10) Patent No.: US 6,511,884 B1
(45) Date of Patent: Jan. 28, 2003

(54) METHOD TO FORM AND/OR ISOLATE VERTICAL TRANSISTORS

(75) Inventors: Elgin Quek, Singapore (SG); Ravi Sundaresan, San Jose, CA (US); Yang Pan, Singapore (SG); Yong Meng Lee, Singapore (SG); Ying Keung Leung, Aberdeen (HK); Yelehanka Ramachandramurthy Pradeep, Singapore (SG); Jia Zhen Zheng, Singapore (SG); Lap Chan, SF, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/972,503

(22) Filed: Oct. 9, 2001

(51) Int. Cl.⁷ .............................................. H01L 21/336
(52) U.S. Cl. ........................ 438/268; 438/173; 438/192; 438/196; 438/206; 438/207; 438/212; 438/217; 438/218; 438/221
(58) Field of Search ................................ 438/173, 174, 438/192, 194, 196, 206, 207, 212, 217, 218, 221, 268

(56) References Cited

U.S. PATENT DOCUMENTS

| | | | |
|---|---|---|---|
| 5,312,767 A | 5/1994 | Shimizu et al. ............... 437/40 |
| 5,413,948 A | 5/1995 | Pfiester et al. ................ 437/41 |
| 5,429,977 A | 7/1995 | Lu et al. ........................ 437/52 |
| 5,670,810 A | 9/1997 | Tamaki et al. ............... 257/331 |
| 5,693,549 A | 12/1997 | Kim ............................. 437/41 |
| 5,773,343 A | 6/1998 | Lee et al. .................... 438/259 |
| 6,069,384 A | 5/2000 | Hause et al. ................ 257/330 |

*Primary Examiner*—Long Pham
(74) *Attorney, Agent, or Firm*—George O. Saile; Rosemary L. S. Pike; Stephen G. Stanton

(57) ABSTRACT

A method of fabricating an isolated vertical transistor comprising the following steps. A wafer having a first implanted region selected from the group comprising a source region and a drain region is provided. The wafer further includes STI areas on either side of a center transistor area. The wafer is patterned down to the first implanted region to form a vertical pillar within the center transistor area using a patterned hardmask. The vertical pillar having side walls. A pad dielectric layer is formed over the wafer, lining the vertical pillar. A nitride layer is formed over the pad dielectric layer. The structure is patterned and etched through the nitride layer and the pad dielectric layer; and into the wafer within the STI areas to form STI trenches within the wafer. The STI trenches are filled with insulative material to form STIs within STI trenches. The patterned nitride and pad dielectric layers are removed. The patterned hardmask is removed. Gate oxide is grown over the exposed portions of the wafer and the vertical pillar. Spacer gates are formed over the gate oxide lined side walls of the vertical pillar. Spacer gate implants are formed within the spacer gates, and a second implanted region is formed within the vertical pillar selected from the group consisting of a drain region and a source region that is not the same as the first implanted region to complete formation of the isolated vertical transistor.

27 Claims, 3 Drawing Sheets

METHOD TO FORM AND/OR ISOLATE VERTICAL TRANSISTORS

The present invention relates generally to fabrication of semiconductor devices, and more specifically to methods of fabricating vertical transistors.

BACKGROUND OF THE INVENTION

Current methods of forming vertical transistors typically make use of a selective epi (epitaxial silicon) which is not a common CMOS (complimentary metal-oxide semiconductor.

U.S. Pat. No. 6,069,384 to Hause et al. describes an integrated circuit including vertical transistors with spacer gates having selected gate widths.

U.S. Pat. No. 5,413,948 to Pfiester et al. describes a method for forming a dual transistor structure.

U.S. Pat. No. 5,773,343 to Lee et al. describes a method of fabricating a semiconductor device having a recessed channel structure.

U.S. Pat. No. 5,693,549 to Kim describes a method of fabricating a thin film transistor with supplementary gates.

U.S. Pat. No. 5,670,810 to Tamaki et al. describes a semiconductor device with a vertical field effect transistor (FET).

U.S. Pat. No. 5,429,977 to Lu et al. describes a method for forming a vertical transistor with a stacked capacitor DRAM (dynamic random access memory) cell.

U.S. Pat. No. 5,312,767 to Shimizu et al. describes a method of fabricating a MOS typed field effect transistor.

SUMMARY OF THE INVENTION

Accordingly, it is an object of the present invention to provide an improved method of isolating vertical transistors.

Another object of the present invention is to provide an improved method of isolating vertical transistors in combination with the fabrication of those vertical transistors.

Other objects will appear hereinafter.

It has now been discovered that the above and other objects of the present invention may be accomplished in the following manner. Specifically, a wafer having a first implanted region selected from the group comprising a source region and a drain region is provided. The wafer further includes STI areas on either side of a center transistor area. The wafer is patterned down to the first implanted region to form a vertical, pillar within the center transistor area using a patterned hardmask. The vertical pillar having side walls. A pad dielectric layer is formed over the wafer, lining the vertical pillar. A nitride layer is formed over the pad dielectric layer. The structure is patterned and etched through the nitride layer and the pad dielectric layer; and into the wafer within the STI areas to form STI trenches within the wafer. The STI trenches are filled with insulative material to form STIs within STI trenches. The patterned nitride and pad dielectric layers are removed. The patterned hardmask is removed. Gate oxide is grown over the exposed portions of the wafer and the vertical pillar. Spacer gates are formed over the gate oxide lined side walls of the vertical pillar. Spacer gate implants are formed within the spacer gates, and a second implanted region is formed within the vertical pillar selected from the group consisting of a drain region and a source region that is not the same as the first implanted region to complete formation of the isolated vertical transistor.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Steps of the Invention

Summarizing the preferred steps of the invention:
1. mask and implant source and well regions deep in substrate (two masks for N-well, P-well; two masks for $N^+$ source, $P^+$ source);
2. using a hardmask, pattern and etch vertical pillars, stopping at source level;
3. deposit a thin pad oxide and a nitride layer over the structure;
4. pattern and etch the nitride layer, continuing the etch through the pad oxide layer and into the substrate to shallow trench isolation (STI) trenches;
5. fill the STI trenches with oxide;
6. remove the remaining nitride and pad oxide layers;
7. remove the hardmask from over the vertical pillars;
8. mask and perform well and threshold-adjust implants;
9. grow gate oxide;
10. deposit polysilicon and pattern and etch gate forming polysilicon spacer gates;
11. mask and implant drain and gate at a small tilt angle, rotating all around the vertical pillar;
12. activate dopants; and
13. continue with the rest of processing.

Initial Structure—Wafer 10 with Implanted Source Regions 12

Figure 1:
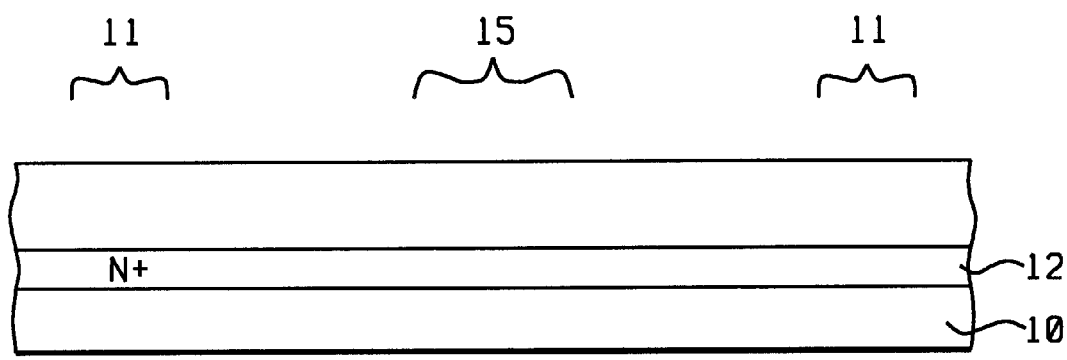
FIGS. 1 to 9 schematically illustrate in cross-sectional representation a preferred embodiment of the present invention.

FIG. 1 illustrates a cross-sectional view of a wafer 10, preferably a semiconductor silicon wafer, after masking (not shown) and implantation of source and well regions/source level ($N^+/P^+$) 12 deep in the Si wafer 10. Si wafer 10 further includes STI areas 11 (designating the location of STIs 24 to be formed) adjacent a central transistor area 15 (designating the location of a vertical transistor 40 to be formed).

Formation of Patterned Hardmask 14

Figure 2:
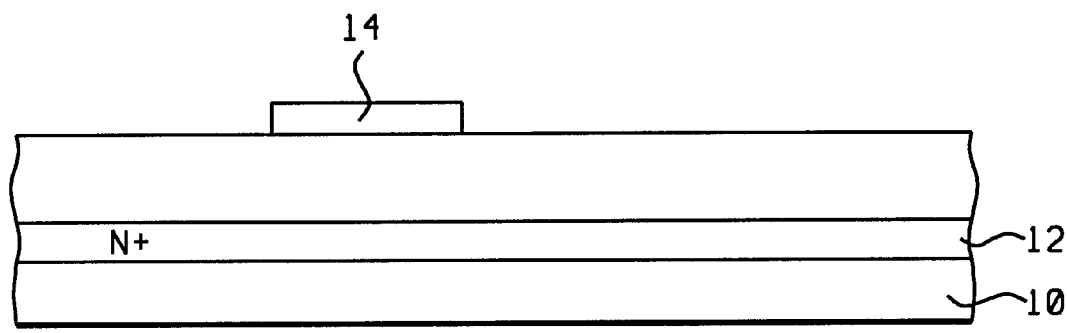

As shown in FIG. 2, patterned hardmask 14 is formed over Si wafer 10 where a vertical pillar(s) is/are desired. Hardmask 14 is preferably comprised of silicon oxynitride.

Etch Vertical Pillar 16

Figure 3:
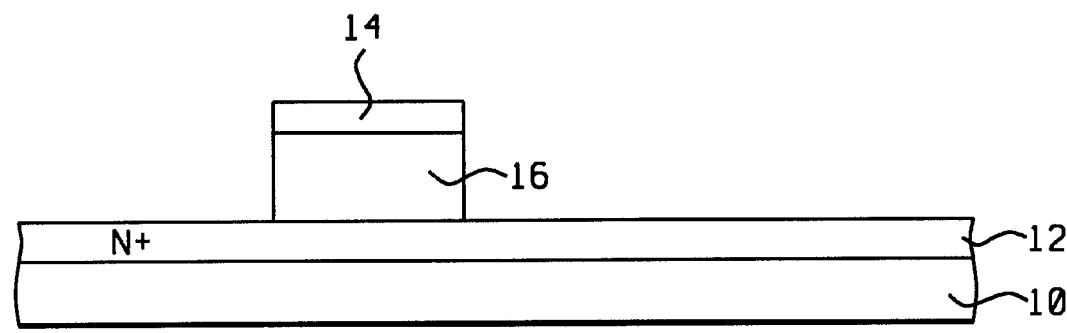

As shown in FIG. 3, Si wafer 10 not under patterned hardmask 14 is etched, stopping at $N^+/P^+$ source regions/level 12.

Deposition of Thin Pad Dielectric 18 and Nitride Layer 20

Figure 4:
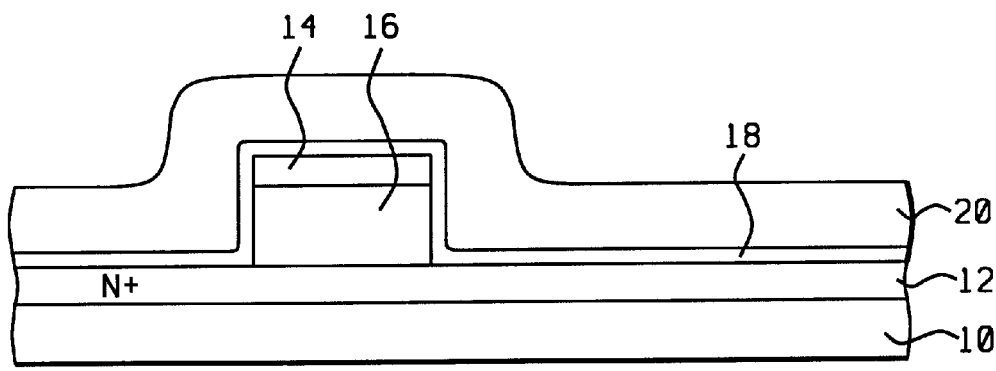

As shown in FIG. 4, thin pad dielectric 18, preferably a thin pad oxide, is deposited over Si wafer 10 and over vertical Si pillar 16 and patterned hardmask 14. Nitride layer 20 is then deposited over thin pad oxide 18. Layer 20 may also be formed of resist in which case the resist layer 20 is exposed and developed instead of being etched.

Key Step of the Invention—Pattern/Etch Nitride Layer 20. Thin Pad Oxide 18 and Si Wafer 10 to form STI Trenches 22

Figure 5:
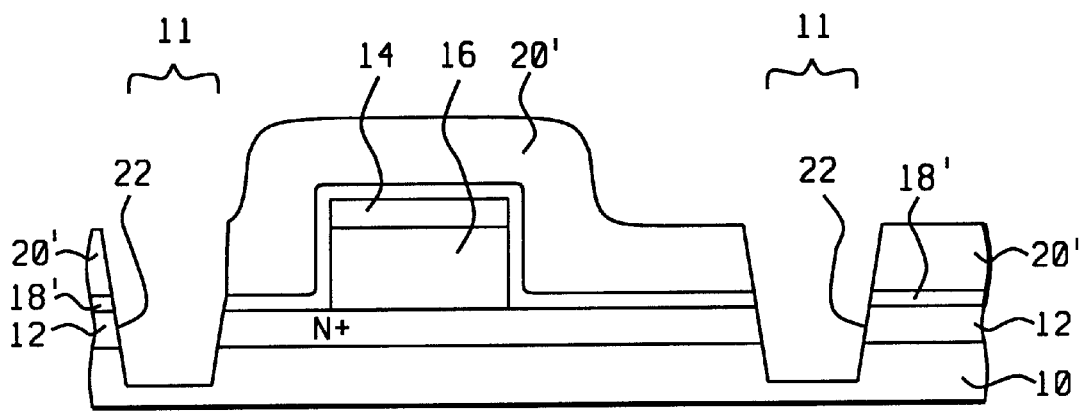

In a key step of the invention and as shown in FIG. 5, nitride layer 20 is patterned and etched, with the etch continuing through thin pad oxide 18 and into Si wafer 10 to form shallow trench isolation (STI) trenches 22 at either side of vertical Si pillar 16, to isolate vertical Si pillar 16 and thus the subsequently finished vertical transistor 40.

This method allows the vertical transistor 40 to stick up above the top of the STI 24 without requiring the use of selective epitaxy.

Filling of STI Trenches 22

Figure 6:
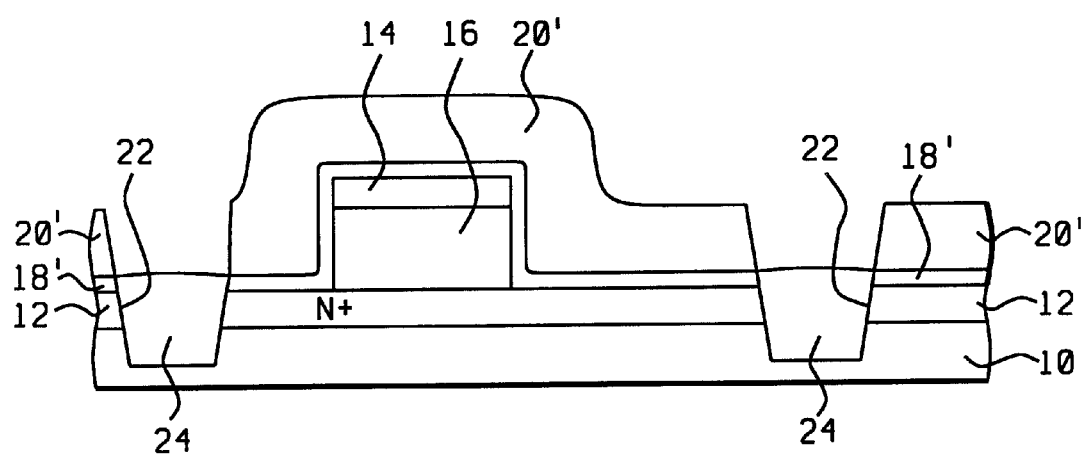

As shown in FIG. 6, STI trenches 22 are then filled with an insulative material, preferably by and with a liquid phase deposited oxide, to form STI's 24.

Removal of Patterned Nitride Layer 20' and Thin Pad Oxide 18'

Figure 7:
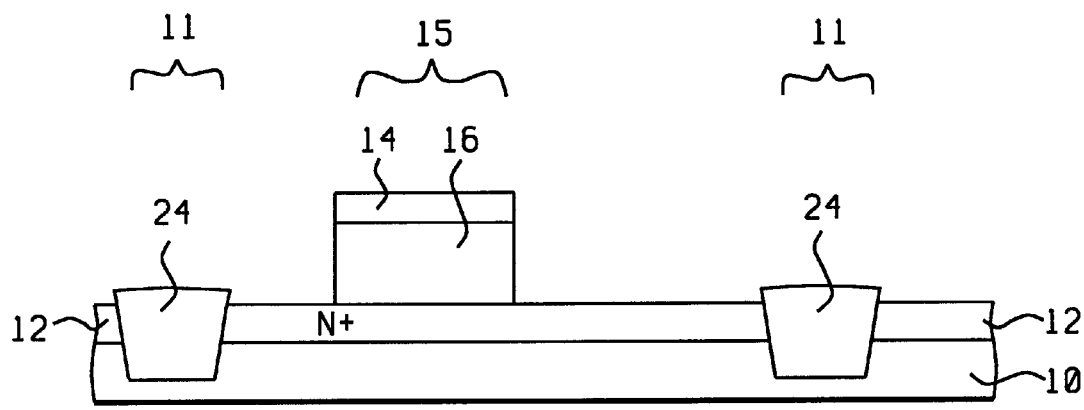

As shown in FIG. 7, patterned nitride layer 20' and thin pad oxide 18' are removed from the structure.

Figure 8:
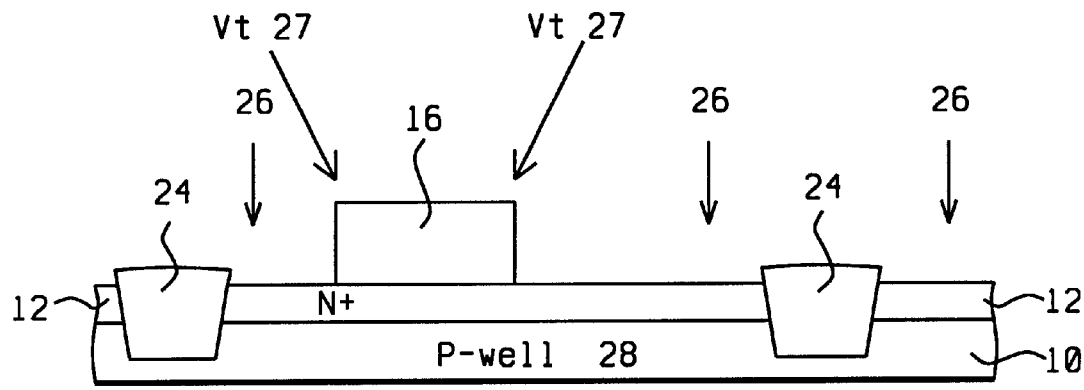

Removal of Patterned Hardmask 14, Masking and Performing Well 26 and Threshold-Voltage ($V_t$) Adjust Implants As shown in FIG. 8, patterned hardmask 14 is removed from vertical Si pillar 16.

The structure is masked (not shown) and well implants 28 and threshold-voltage ($V_t$) adjust implants (not shown) are performed as at 26 and 27, respectively. The threshold-voltage ($V_t$) adjust implants form the channel (not shown). One mask is used to form a P-type adjust implant and an N-type threshold-voltage ($V_t$) adjust implant.

Grow Gate Oxide 30

Figure 9:
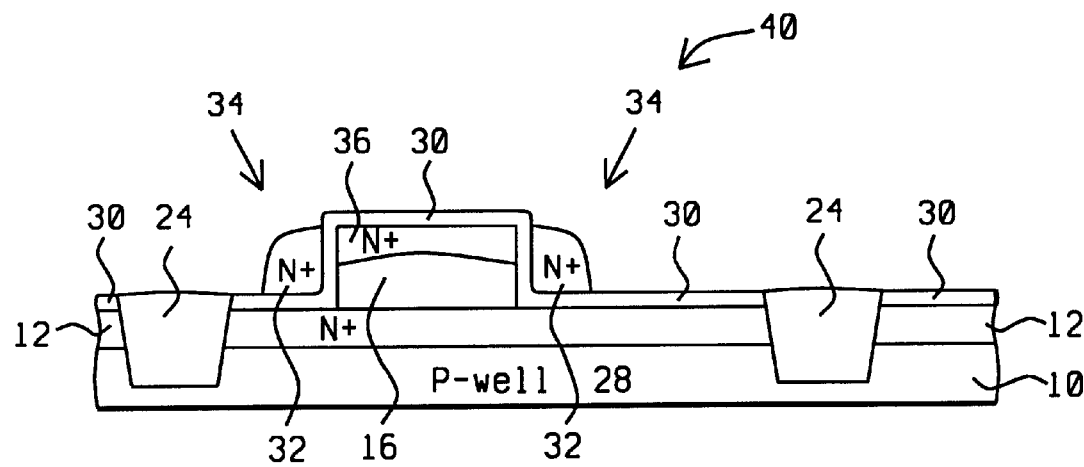

As shown in FIG. 9, gate oxide 30 is grown over the exposed portions of silicon (Si) over Si wafer 10 and the side walls and top of vertical Si pillar 16.

Form Spacer Gate (Vertical Gate) 32

As shown in FIG. 9, spacer gate (vertical gate) 32 are formed over gate oxide lined side walls of vertical Si pillar 16 proximate the channel(s) (not shown), preferably by depositing polysilicon (poly), patterning the poly and etching gate to form poly spacer gates 32. The vertical area adjacent spacer gate 32 are channels. This is necessary to define poly lines for connecting gates together or for forming contact landing pads.

Mask and Implant Drain 36 and Gate 32

As shown in FIG. 9, the structure is masked (not shown) and drain 36 and spacer gate 32 implants are performed preferably at a small tilt angle as at 34, rotating all around vertical Si pillar 16. The poly gates are doped at the same time.

The dopants are activated and further processing may be done.

The present invention may also be practiced without STIs is some other means of isolation is used such as junction isolation (high parasitic capacitance and low junction breakdowns) or LOCOS (needs high temperature oxidation).

Another way of forming the vertical transistor would have the source regions implanted at the same time as the drain (after STI formation). This would eliminate the need for the buried $N^+$ or $P^+$ layer 12. This would also give better transistor characteristics as the height of the transistor pillar (channel length) is scaled down.

Advantages of the Invention

The advantages of one or more embodiments of the dual-gate CMOS device fabrication method of the present invention include:

1) the advantages of vertical transistor architecture;

2) no reliance upon selective epitaxy; and 3) no reliance upon CMP for forming STIs.

While particular embodiments of the present invention have been illustrated and described, it is not intended to limit the invention; except as defined by the following claims.

We claim:

1. A method of fabricating an isolated vertical transistor, comprising the steps of:

providing a wafer having a first implanted region selected from the group comprising a source region and a drain region; the wafer further including STI areas either side of a center transistor area;

patterning the wafer down to the first implanted region to form a vertical pillar within the center transistor area using a patterned hardmask; the vertical pillar having side walls;

forming a pad dielectric layer over the wafer, lining the vertical pillar;

forming a nitride layer over the pad dielectric layer;

patterning the structure and etching through: the nitride layer; the pad dielectric layer and into the wafer within the STI areas to form STI trenches within the wafer;

filling the STI trenches with insulative material to form STIs within STI trenches;

removing the patterned nitride and pad dielectric layers;

removing the patterned hardmask;

growing gate oxide over the exposed portions of the wafer and the vertical pillar; and forming spacer gates over the gate oxide lined side walls of the vertical pillar; and forming spacer gate implants within the spacer gates and a second implanted region within the vertical pillar selected from the group consisting of a drain region and a source region that is not the same as the first implanted region to complete formation of the isolated vertical transistor.

2. The method of claim 1, wherein the wafer is comprised of silicon and the hardmask is comprised of silicon oxynitride.

3. The method of claim 1, wherein the pad dielectric layer is a thin pad oxide layer; and the STI insulative material is oxide.

4. The method of claim 1, wherein the wafer is comprised of silicon; the hardmask is comprised of silicon oxynitride; the pad dielectric layer is a thin pad oxide layer; and the STI insulative material is oxide.

5. The method of claim 1, wherein the STI trenches are filled with a liquid phase deposited oxide to form the STIs.

6. The method of claim 1, including the step of forming well implants and threshold-voltage ($V_t$) adjust implants after the patterned hardmask is removed and before the gate oxide is grown.

7. The method of claim 1, including the step of forming well implants and P-type and N-type threshold-voltage ($V_t$) adjust implants after the patterned hardmask is removed and before the gate oxide is grown.

8. The method of claim 1, wherein the spacer gates are formed of polysilicon.

9. The method of claim 1, wherein the spacer gates are formed by depositing and patterning polysilicon.

10. The method of claim 1, wherein the spacer gate implants within spacer gates and the second implanted region within the vertical pillar are performed at an implant rotating around the vertical pillar at an angle tilted to vertical.

11. A method of fabricating an isolated vertical transistor, comprising the steps of:
providing a wafer having a first implanted region selected from the group comprising a source region, a drain region and well-implant regions; the wafer further including STI areas either side of a center transistor area;
patterning the wafer down to the first implanted region to form a vertical pillar within the center transistor area using a patterned hardmask; the vertical pillar having side walls;
forming a pad dielectric layer over the wafer, lining the vertical pillar;
forming a nitride layer over the pad dielectric layer;
patterning the structure and etching through: the nitride layer; the pad dielectric layer and into the wafer within the STI areas to form STI trenches within the wafer;
filling the STI trenches with insulative material to form STIs within STI trenches;
removing the patterned nitride and pad dielectric layers;
removing the patterned hardmask;
forming well implants into the wafer and threshold-voltage ($V_t$) adjust implants into the vertical pillar;
growing gate oxide over the exposed portions of the wafer and the vertical pillar; and
forming spacer gates over the gate oxide lined side walls of the vertical pillar; and
forming spacer gate implants within the spacer gates and a second implanted region within the vertical pillar selected from the group consisting of a drain region and a source region that is not the same as the first implanted region to complete formation of the isolated vertical transistor.

12. The method of claim 11, wherein the wafer is comprised of silicon and the hardmask is comprised of silicon oxynitride.

13. The method of claim 11, wherein the pad dielectric layer is a thin pad oxide layer; and the STI insulative material is oxide.

14. The method of claim 11, wherein the wafer is comprised of silicon; the hardmask is comprised of silicon oxynitride; the pad dielectric layer is a thin pad oxide layer; and the STI insulative material is oxide.

15. The method of claim 11, wherein the STI trenches are filled with a liquid phase deposited oxide to form the STIs.

16. The method of claim 11, including the step of forming well implants and P-type and N-type threshold-voltage ($V_t$) adjust implants after the patterned hardmask is removed and before the gate oxide is grown.

17. The method of claim 11, wherein the spacer gates are formed of polysilicon.

18. The method of claim 11, wherein the spacer gates are formed by depositing and patterning polysilicon.

19. The method of claim 11, wherein the spacer gate implants within spacer gates and the second implanted region within the vertical pillar are performed at an implant rotating around the vertical pillar at an angle tilted to vertical.

20. A method of fabricating an isolated vertical transistor, comprising the steps of:
providing a silicon wafer having a first implanted region selected from the group comprising a source region, a drain region and well-implant regions; the silicon wafer further including STI areas either side of a center transistor area;
patterning the silicon wafer down to the first implanted region to form a vertical pillar within the center transistor area using a patterned silicon oxynitride hardmask; the vertical pillar having side walls;
forming a pad dielectric layer over the silicon wafer, lining the vertical pillar;
forming a nitride layer over the pad dielectric layer;
patterning the structure and etching through: the nitride layer; the pad dielectric layer and into the silicon wafer within the STI areas to form STI trenches within the silicon wafer;
filling the STI trenches with insulative material to form STIs within STI trenches;
removing the patterned nitride and pad dielectric layers;
removing the patterned silicon oxynitride hardmask;
forming well implants into the silicon wafer and threshold-voltage ($V_t$) adjust implants into the vertical pillar;
growing gate oxide over the exposed portions of the silicon wafer and the vertical pillar; and
forming spacer gates over the gate oxide lined side walls of the vertical pillar; and
forming spacer gate implants within the spacer gates and a second implanted region within the vertical pillar selected from the group consisting of a drain region and a source region that is not the same as the first implanted region to complete formation of the isolated vertical transistor.

21. The method of claim 20, wherein the pad dielectric layer is a thin pad oxide layer; and the STI insulative material is oxide.

22. The method of claim 20, wherein the pad dielectric layer is a thin pad oxide layer; and the STI insulative material is oxide.

23. The method of claim 20, wherein the STI trenches are filled with a liquid phase deposited oxide to form the STIs.

24. The method of claim 20, including the step of forming well implants and P-type and N-type threshold-voltage ($V_t$) adjust implants after the patterned silicon oxynitride hardmask is removed and before the gate oxide is grown.

25. The method of claim 20, wherein the spacer gate s are formed of polysilicon.

26. The method of claim 20, wherein the spacer gates are formed by depositing and patterning polysilicon.

27. The method of claim 20, wherein the spacer gate implants within spacer gates and the second implanted region within the vertical pillar are performed at an implant rotating around the vertical pillar at an angle tilted to vertical.

* * * * *

UNITED STATES PATENT AND TRADEMARK OFFICE
CERTIFICATE OF CORRECTION

PATENT NO.    : 6,511,884 B1
DATED         : January 28, 2003
INVENTOR(S)   : Elgin Quek et al.

It is certified that error appears in the above-identified patent and that said Letters Patent is hereby corrected as shown below:

<u>Title page,</u>
Item [75], delete "Yong Meng Lee", and replace with -- James Yong Meng Lee -- and delete "Ying Keung Leung, Aberdeen (HK)" and replace with -- Ying Keung Leung, Hong Kong (HK) --.

Signed and Sealed this

Seventeenth Day of June, 2003

JAMES E. ROGAN
*Director of the United States Patent and Trademark Office*